(12) United States Patent
Ray

(10) Patent No.: US 7,453,160 B2
(45) Date of Patent: Nov. 18, 2008

(54) SIMPLIFIED WAFER ALIGNMENT

(75) Inventor: Andrew M. Ray, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 575 days.

(21) Appl. No.: 10/830,734

(22) Filed: Apr. 23, 2004

(65) Prior Publication Data

US 2005/0251279 A1    Nov. 10, 2005

(51) Int. Cl.
*H01L 23/544*    (2006.01)

(52) U.S. Cl. .................. 257/797; 414/744.6; 414/935

(58) Field of Classification Search .............. 257/283, 257/797; 438/401, 462, 975, FOR. 435; 700/114, 157; 414/744.6, 754, 784, 780, 414/800, 936, 935
See application file for complete search history.

(56) References Cited

U.S. PATENT DOCUMENTS

| | | | |
|---|---|---|---|
| 5,608,223 A | | 3/1997 | Hirokawa et al. |
| 6,126,380 A | * | 10/2000 | Hillman ................... 414/744.6 |
| 6,222,196 B1 | | 4/2001 | Mack |
| 6,428,399 B1 | * | 8/2002 | Tanabe et al. ................. 451/66 |
| 6,537,836 B2 | * | 3/2003 | Summerer .................... 438/16 |
| 6,555,832 B1 | | 4/2003 | Ryding et al. |
| 6,577,382 B2 | * | 6/2003 | Kida et al. .................... 355/77 |
| 6,633,046 B1 | | 10/2003 | Mitchell et al. |
| 6,727,980 B2 | * | 4/2004 | Ota et al. ...................... 355/55 |
| 6,778,275 B2 | * | 8/2004 | Bowes ........................ 356/400 |
| 6,888,260 B2 | * | 5/2005 | Carpi et al. .................. 257/797 |
| 6,944,517 B2 | * | 9/2005 | Krupyshev .................. 700/114 |
| 7,348,275 B2 | * | 3/2008 | Sekiya ........................ 438/690 |
| 2001/0029082 A1 | * | 10/2001 | Fujiwara ..................... 438/401 |
| 2002/0009900 A1 | * | 1/2002 | Tay et al. ..................... 438/786 |
| 2002/0113218 A1 | * | 8/2002 | Okumura et al. ............. 250/548 |
| 2003/0010280 A1 | * | 1/2003 | Sugihara et al. ............... 117/97 |
| 2003/0124820 A1 | * | 7/2003 | Johnsgard et al. ........... 438/482 |
| 2005/0181575 A1 | * | 8/2005 | Summerer .................. 438/401 |
| 2005/0251279 A1 | * | 11/2005 | Ray ........................... 700/114 |

\* cited by examiner

*Primary Examiner*—W. David Coleman
*Assistant Examiner*—Khiem D Nguyen
(74) *Attorney, Agent, or Firm*—Eschweiler & Associates, LLC

(57) ABSTRACT

The present invention is directed to aligning wafers within semiconductor fabrication tools. More particularly, one or more aspects of the present invention pertain to quickly and efficiently finding an alignment marking, such as an alignment notch, on a wafer to allow the wafer to be appropriately oriented within an alignment tool. Unlike conventional systems, the notch is located without firmly holding and spinning or rotating the wafer. Exposure to considerable backside contaminants is thereby mitigated and the complexity and/or cost associated with aligning the wafer is thereby reduced.

15 Claims, 8 Drawing Sheets

SIMPLIFIED WAFER ALIGNMENT

FIELD OF THE INVENTION

The present invention relates generally to semiconductor fabrication, and more particularly to a technique for simplifying wafer alignment.

BACKGROUND OF THE INVENTION

Wafers used in semiconductor fabrication are typically formed from a crystalline material, such as bulk silicon. In particular, very specific types of single crystals of silicon, known as boules, are grown into long lengths and thin slices (e.g., wafers) are cut there-from. The crystalline structure of the wafers is advantageous in forming semiconductor devices because it facilitates control over the electrical properties of the devices and exhibits uniform electrical performance throughout the entire semiconductor material. Additionally, because impurities that degrade device performance tend to collect around irregularities in the atomic structure of a material, the regularity of the crystalline structure provides for very predictable device performance and yield.

In forming semiconductor devices on silicon wafers, the wafers generally go through many fabrication stages. Consequently, the wafers may pass through different semiconductor processing tools one or more times. One such tool is an ion implanter. Ion implanters are utilized to selectively bombard regions of a wafer with ions of a dopant material. The ions penetrate into the wafer and alter the composition thereof, thus giving the regions of the wafer particular electrical characteristics, such a may be useful for fashioning certain semiconductor devices, such as transistors, upon the wafer.

It can be appreciated that the orientation of a wafer relative to a processing tool can be important. With regard to ion implanters, for example, it may be desirable to "align" the wafer with a beam of dopant ions so that few ions encounter the lattice structure of the wafer and the ions are thereby implanted relatively deeply into the wafer or substrate. Alternatively, it may be desirable to somewhat "mis-align" the wafer so that some of the ions encounter the lattice structure and are blocked, slowed down or reflected thereby. In either instance, improper alignment can lead to undesired degrees of channeling (e.g., too little or too much). Additionally, the deviations from the nominal lattice orientation and the dimensions of features formed upon the wafer can affect shadowing, and adversely impact the implantation process and resulting semiconductor devices.

Accordingly, wafers generally possess some indicia of their lattice structure. For example, the wafers are usually designated with Miller Index data, such as 1,0,0, which is indicative of a nominal lattice structure of the wafer relative to the mechanical or cut surface of the wafer. The wafers also typically have a feature that denotes the axis of the wafer crystal. This feature is often a notch or a flat edge along the outer perimeter of the wafer. The number of features and orientation relative to each other are used to denote the crystal type of the wafer and are controlled by Semiconductor Equipment and Materials International (SEMI) specifications. Larger wafer sizes (e.g., 200 and 300 mm) have generally standardized on a notch rather than a flat edge.

A number of commercial aligners are available and generally operate by placing a wafer on the aligner by a robot. The wafer is captured by some mechanism that allows the wafer to spin. This spinning is used to pass the perimeter of the wafer through some type of sensor to locate the notch. A traditional method of capturing the wafer is to use a vacuum chuck located at the center of wafer. However, since most systems operate in a vacuum, it can be difficult to also capture the wafer via vacuum. Additionally, backside contamination can become problematic as one or more wafers may have to pass through the same or different tools multiple times during the fabrication process. This may require multiple re-alignments whereby contaminants such as particles may get transferred to the aligner and the backsides of the wafers. Such contaminants can adversely affect subsequent processing and ultimately degrade device performance.

Accordingly, edge grip aligners are also being used. Edge grip aligners have the advantage of low backside contamination, but have the disadvantage of interfering with the edge of the wafer that is being scanned. In some cases, locating the notch requires re-clamping at a different location and therefore reducing throughput. Once the notch is located, the wafer is generally rotated again to a pre-determined orientation relative to the notch. Typically this orientation is a value that is communicated to the aligner and it may vary batch to batch depending on process conditions.

Conventional aligners may also provide a centering capability. For example, a centering ring can be actuated to mechanically center the wafer after the wafer has been placed on the aligner by the robot. Other aligners can locate the center of the wafer during the alignment process and provide the true center position. Regardless, after the notch has been located and the wafer center has been found, the same or a different robot can retrieve the wafer (e.g., by picking the wafer at a new location that is the wafer center) and maneuver it to a fabrication tool.

Nevertheless, the potential for wafer damage and backside contamination, the difficulty in holding and maneuvering the wafers, and long cycle times associated with centering the wafers, locating the notches and re-orienting the wafers leaves room for improvement in alignment systems.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention is directed to aligning wafers within semiconductor fabrication tools. More particularly, one or more aspects of the present invention pertain to quickly and efficiently finding an alignment marking, such as an alignment notch, on a wafer to allow the wafer to be appropriately oriented within an alignment tool. Unlike conventional systems, the notch is located without firmly holding and spinning or rotating the wafer. Exposure to considerable backside contaminants is thereby mitigated and the complexity and/or cost associated with aligning the wafer is thereby reduced.

According to one or more aspects of the present invention, a system is disclosed that is adapted to locate an alignment marking on a semiconductor wafer. The system includes a shaft and a sleeve moveably mounted upon the shaft. One or more support pins are mounted to one end of the shaft and are adapted to support a wafer situated thereon. An arm member is operatively coupled to the sleeve, and an end of the arm member extends up toward the wafer when the wafer resides on the one or more support pins. The end of the arm member is operative to establish a beam of radiation that may be intersected by the perimeter of the wafer. The wafer can thus be scanned by rotating the arm member around the perimeter of the wafer and the marking can be identified by a change in the amount of radiation transmitted past the wafer.

In accordance with one or more other aspects of the present invention, a mechanism adapted to locate an alignment marking on a semiconductor wafer is disclosed. The mechanism includes a support structure for holding the wafer, the support structure contacting a small amount of surface area of a backside of the wafer to mitigate particle contamination. The mechanism also includes a member that moves relative to the wafer to detect the alignment marking.

According to one or more other aspects of the present invention, a method of detecting an alignment marking located on a perimeter of a wafer is disclosed. The method includes holding the wafer on a support structure that contacts a small amount of surface area of a backside of the wafer to mitigate particle contamination. The method also includes moving a member around the wafer to detect the alignment marking.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
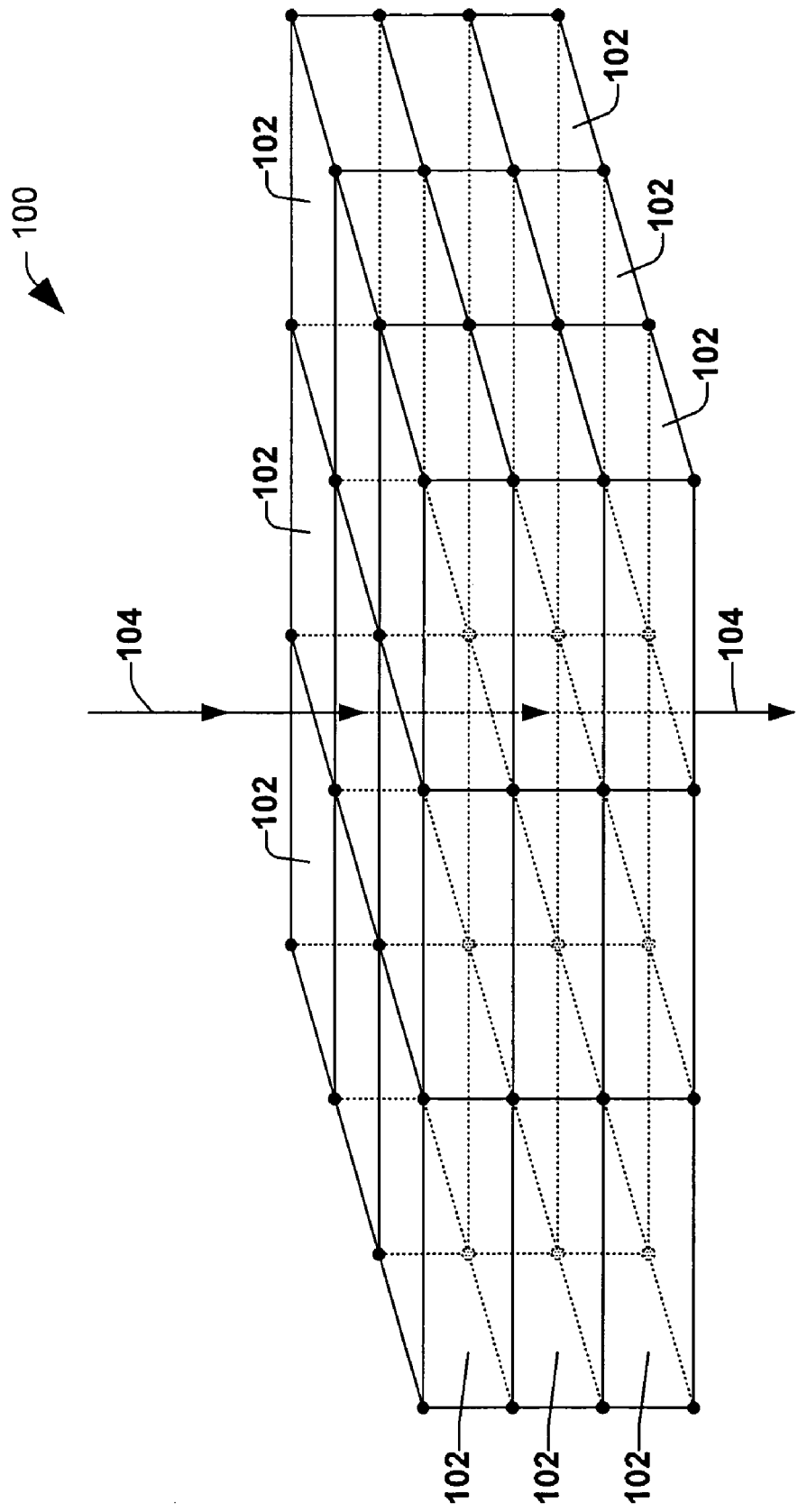
FIG. 1 is a perspective view of an example of a portion of a lattice structure wherein an ion beam is directed at the lattice structure at an angle substantially equal to ninety degrees.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention is directed to aligning wafers within semiconductor fabrication tools. More particularly, one or more aspects of the present invention pertain to quickly and efficiently finding an alignment marking, such as an alignment notch, on a wafer to allow the wafer to be appropriately oriented within an alignment tool. Unlike conventional systems, the notch is located without firmly holding and spinning or rotating the wafer. Exposure to considerable backside contaminants is thereby mitigated and the complexity and/or cost associated with aligning the wafer is thereby reduced.

As alluded to above, in some instances it is important to properly align a wafer within a semiconductor processing tool. For example, a wafer may have to be aligned in a particular manner in an ion implanter to achieve a desired level of channeling and/or shadowing. Turning to FIG. 1, for example, a portion of a generic lattice structure 100 having a generally cubic configuration is illustrated. In the example illustrated, the lattice structure 100 has twenty-seven (e.g., three by three by three) cells 102 that are themselves all generally cubical in shape. It is to be appreciated, however, that lattice structures can come in any of a variety of different configurations and can have any number of cells having any number of a variety of different shapes, such as diamond, pyramidal, hexagonal, etc.

The direction of a beam of dopant ions 104 in FIG. 1 is substantially perpendicular to a plane of the lattice structure such that the beam may pass there-through without encountering many, if any, portions of the lattice structure. As such, the ions may be implanted somewhat deeply within the substrate. This may or may not be desirable depending upon the resulting electrical characteristics. It can be appreciated that other aspects can also affect channeling, such as the degree of amorphization of the substrate, the atomic mass of the substrate and the mass and/or energy of ions within the beam, for example. For instance, the greater the mass and/or energy of the ions within the beam 104, the more likely the ions may be implanted deeply into the substrate.

Figure 2:
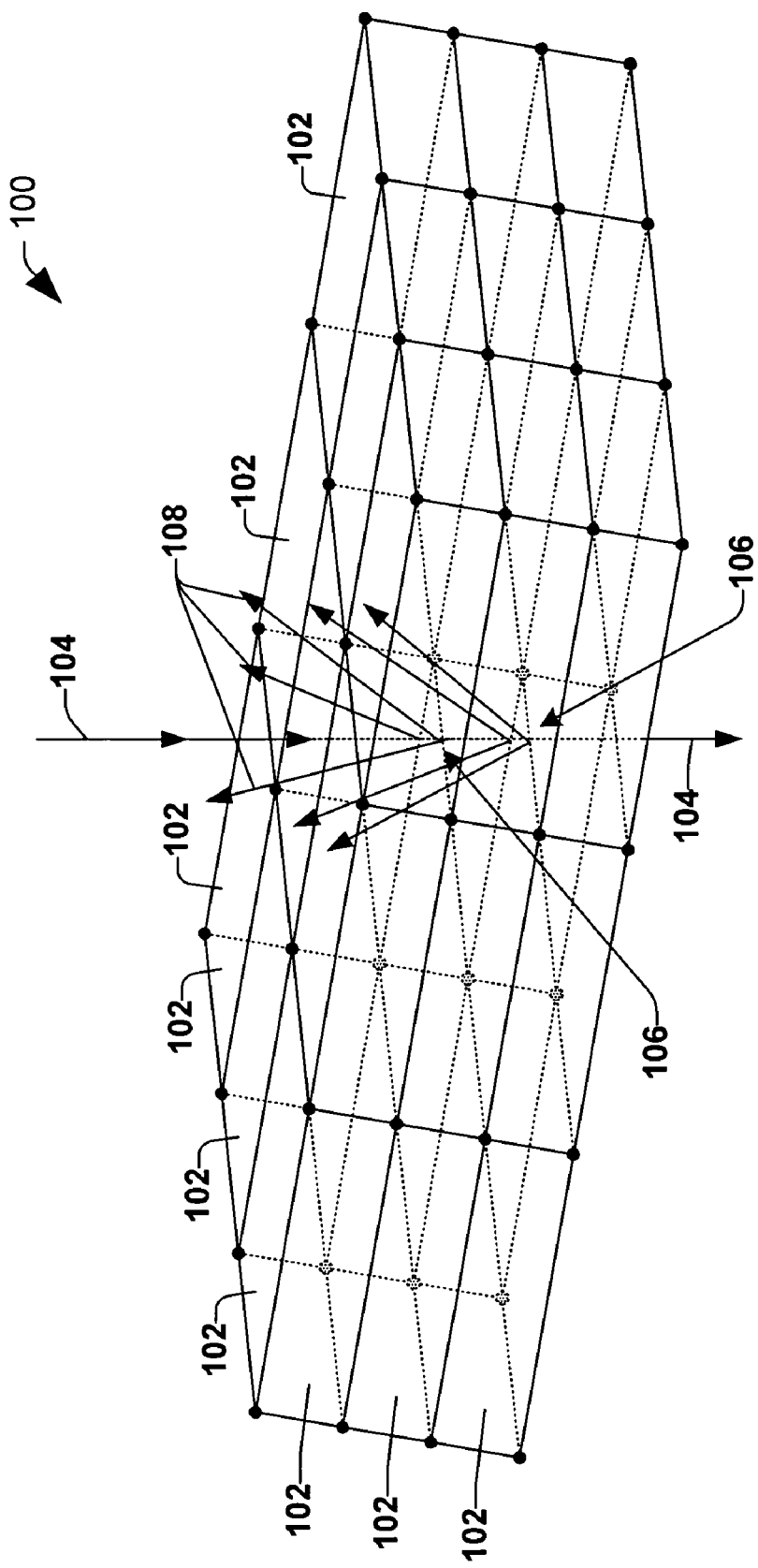
FIG. 2 is a perspective view of an example of a portion of a lattice structure, such as that depicted in FIG. 1, wherein an ion beam is directed at the lattice structure at an angle other than about ninety degrees.

By way of further illustration, in FIG. 2 the direction of the beam 104 is not substantially perpendicular to a plane of the lattice structure 100. As such, some of the ions within the ion beam 104 will likely encounter portions 106 of the lattice structure and either lose energy and/or be slowed down thereby or be reflected or deflected away from these portions as indicated by arrows 108, and thereby come to rest in shallow portions of the implanted material. As such, it may be desirable to direct the ion beam at an angle other than ninety degrees to the lattice structure 100 to mitigate the amount of channeling and control the depth to which dopant ions are implanted within the substrate.

Another consideration regarding wafer alignment in an implantation tool is shadowing. For example, a continuing trend in the electronics industry is to scale down electronic devices to produce smaller, yet more powerful devices (e.g., cell phones, digital cameras, etc.) that can perform a greater number of increasingly complex functions with less power. To achieve this, semiconductor components, such as transistors, and features thereof are continually reduced in size and formed closer together. This increased "packing" can lead to shadowing, however, whereby portions of the wafer to be doped receive little to no dopant ions. Additionally, such shadowing can become exaggerated where an implantation angle is increased, such as to diminish channeling, for example.

Figure 3:
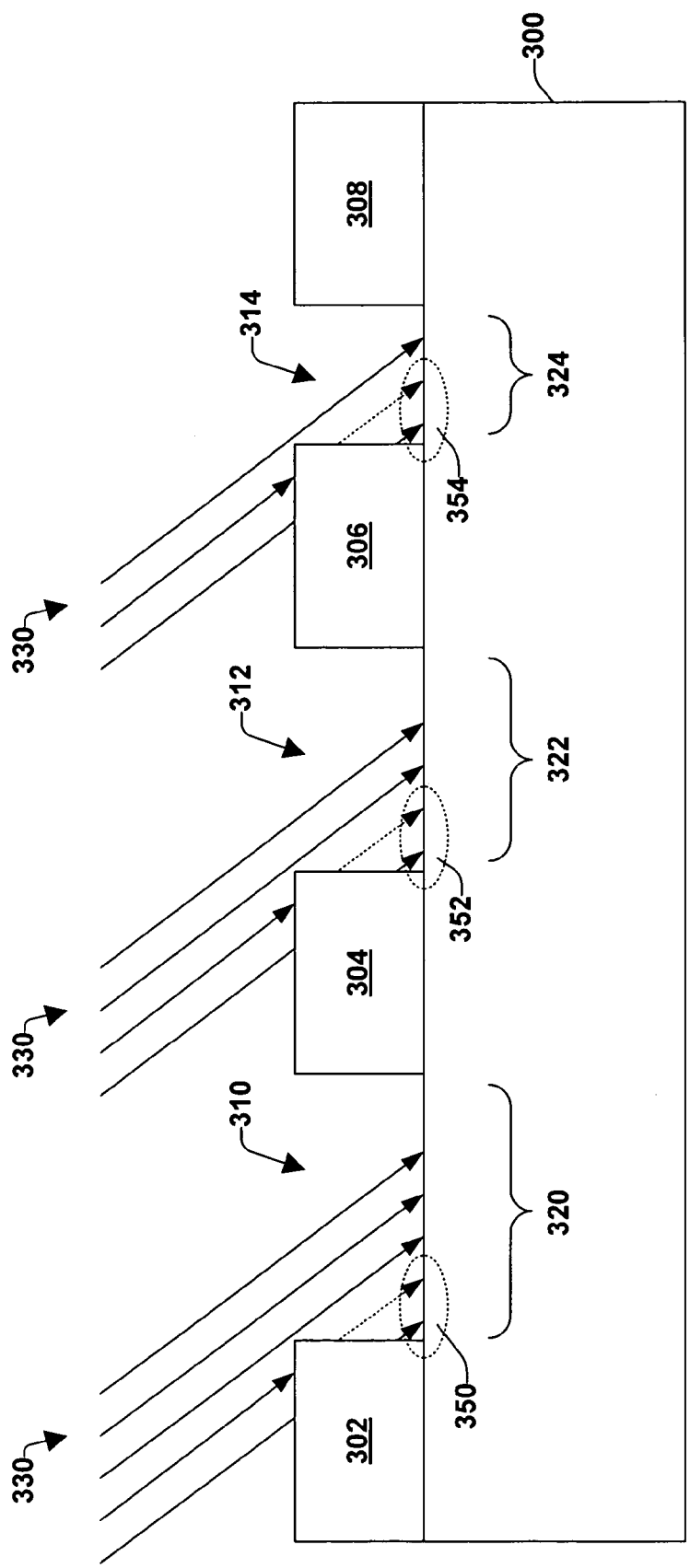
FIG. 3 is a cross-sectional side view of a portion of a semiconductor substrate or wafer having features formed thereon that are separated by varying distances and that experience shadowing effects to varying degrees during ion implantation.

Turning to FIG. 3, for example, a cross sectional view of a portion of a semiconductor substrate or wafer 300 has a plurality of features 302, 304, 306, 308 formed thereon, and respective spacings 310, 312, 314 defined between the features. The features 302, 304, 306, 308 are all of substantially the same height. Some of the resist features 302, 304, 306, 308 are, however, formed closer together than others, and thus the corresponding spacings 310, 312, 314 there-between are of different widths. Areas 320, 322, 324 of the substrate 300 exposed by the spacings 310, 312, 314 are doped via an ion implantation tool.

Accordingly, one or more ion beams 330 are directed at the substrate 300 to perform the doping. The beams 330 are directed at an angle (e.g., to mitigate channeling) and thus have a portion of their ions blocked by areas (e.g., corners) of the features 302, 304, 306, 308. As such, regions 350, 352, 354 within the substrate areas 320, 322, 324 receive less than intended amounts of dopant ions. It can be seen that as the features 302, 304, 306, 308 are brought closer together and the respective spacings 310, 312, 314 are thereby made more narrow, the insufficiently doped regions 350, 352, 354 make up larger and larger portions of the substrate areas 320, 322, 324. Thus, proper alignment of a wafer within an implantation tool becomes more and more important as scaling continues (e.g., so that a desired level of channeling is achieved, while shadowing is sufficiently mitigated).

Certain types of semiconductor fabrication tools, such as ion implanters, have the ability to re-orient a wafer while the wafer is in a processing position. Ion implanters can, for example, rotate a wafer between different implantation steps. For example, a "quad" implant may be performed whereby a wafer is repeatedly rotated and implanted with ions. This may be done, for example, to more thoroughly dope areas 320, 322, 324 between features 302, 304, 306, 308 that would otherwise be insufficiently and/or unevenly doped. The addition of a motor axis within processing tools may also enable a change in the twist angle, either by spinning the wafer or by combining control of two axis of tilt to set the tilt and twist orientation.

In accordance with one or more aspects of the present invention, an alignment mechanism is implemented where a wafer need not be rotated to find an alignment notch. The wafer is instead scanned by an instrument that moves around the stationary wafer. Since the wafer does not have to move, it need not be held tightly in place (e.g., via vacuum). Rather, the wafer can rest on a few pins, for example. This significantly mitigates the opportunity for particle transfer and backside contamination. Not having to rotate the wafer also reduces equipment costs among other things. Additionally, scanning a stationary wafer can greatly improve cycle times by mitigating centripetal concerns associated with spinning the wafer at high speeds. Not having to "re-grip" and/or re-orient wafers also helps to mitigate costs and improves cycle times and yields.

Figure 4:
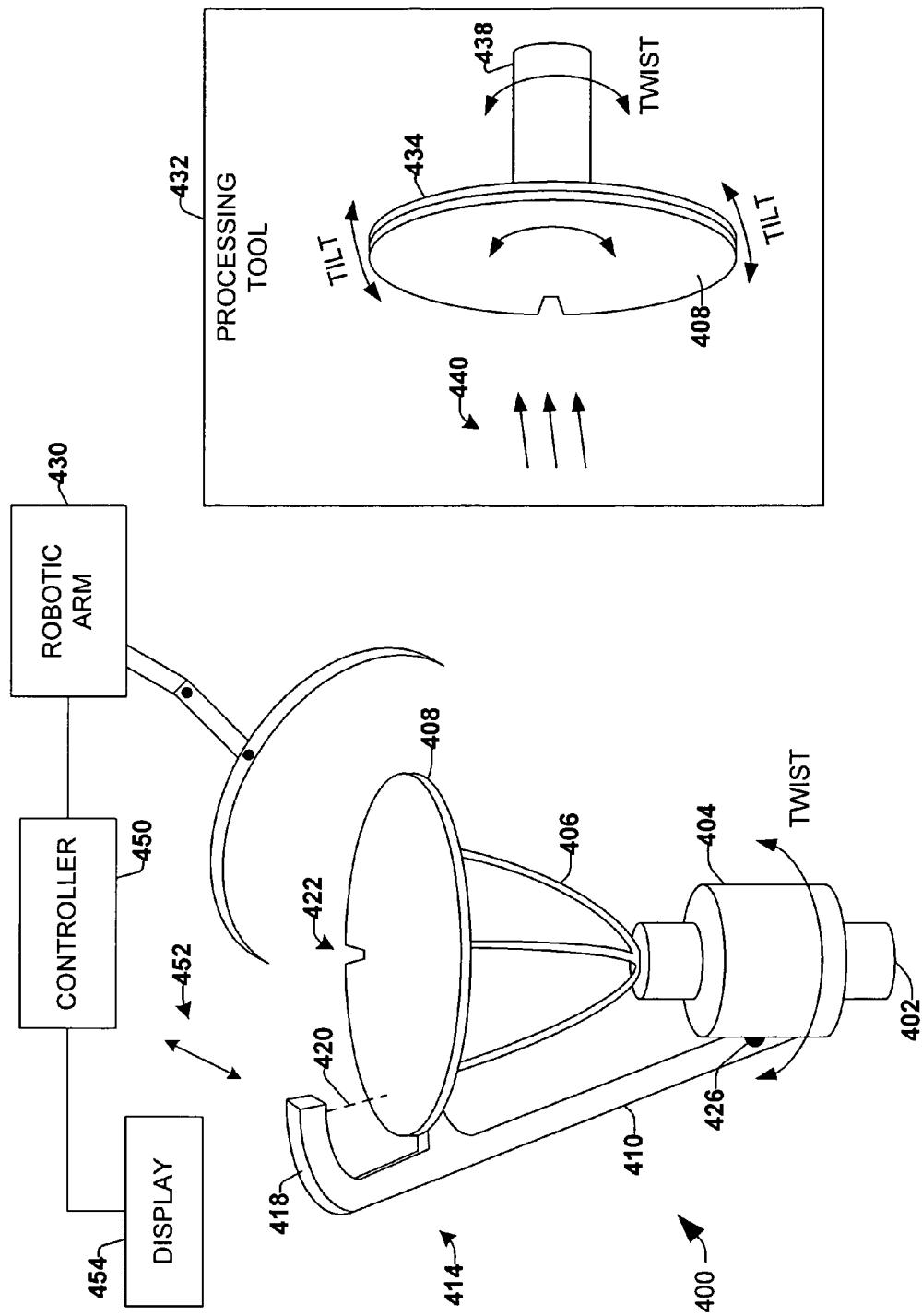
FIG. 4 illustrates an exemplary system suitable for identifying an alignment mark in accordance with one or more aspects of the present invention.

An exemplary mechanism is illustrated in FIG. 4. The alignment mechanism 400 includes a shaft 402 and a sleeve 404 moveably (e.g., rotateably) mounted around the shaft 402. One or more support pins 406 are also mounted upon one end of the shaft 402. The support pins 406 are operable to hold a wafer 408 that rests thereon. An arm member 410 is operatively coupled to the sleeve 404 and extends up towards the wafer 408. An end 414 of the arm 410 near the wafer 408 has one or more protrusions 418 that extend there-from. One or more of the protrusions 418 are adapted to establish a beam of light or other type radiation 420 there-between that may be intersected by a perimeter of the wafer 408.

To align the wafer 408, the mechanism 400 is adapted to locate an identifying notch 422 within the wafer 408. However, rather than spinning the wafer 408, the sleeve 404 allows the arm 410 to rotate around the shaft 402 in a controllable manner. This allows the arm 410, and more particularly the beam of light 420, to "scan" the perimeter of the wafer 408. In one example, the notch 422 may be identified when the beam of light 420 is no longer wholly or partially interrupted by the perimeter of the wafer 408 which intersects the beam 420. The end 414 of the arm 410 may also, for example, be moved closer to or further away from the wafer 408, such as via one or more pivot points 426 (e.g., that can be controlled by a motor (not shown)). This allows the end 414 of the arm 410 to extend more or less of the beam of light 420 onto the wafer 408. It will be appreciated that the size of the alignment notch 422 is exaggerated in the Figs. for purposes of illustration and that alignment notches generally comprise a gap of only around one millimeter.

Once the alignment mark 422 is identified on the wafer 408, a robotic arm 430 may then pick the wafer 408 up and move it to a processing tool 432, such as an ion implanter. The wafer 408 may be placed upon some type of clamping mechanism 434, such as an electrostatic clamp, to be held in place within the tool 432. The tool 432 may have the ability to twist the wafer 408 via a rotateable shaft 438, as well as to tilt the wafer 408 via some type of maneuverable platform (e.g., to allow a beam of ions 440 directed at the wafer 408 to establish more evenly implanted areas within the wafer 408 and mitigate shadowing). By way of example, U.S. Pat. No. 4,975,586 to Ray discloses an exemplary end station and components thereof in slightly greater detail, where the end station has a wafer support or holder that is maneuverable about multiple axes. The entirety of this patent is thus hereby fully incorporated by reference.

A controller or CPU 450 may be included to control the operation of the alignment mechanism 400. The controller 450 may be an integral part of the mechanism 400 and/or operatively coupled thereto (e.g., via hardwiring and/or rf signals 452). The controller 450 can, for example, regulate the speed at which the arm 410 rotates about the wafer 408 and/or the closeness of the end 414 of the arm 410 to the wafer 408 (e.g., by controlling a motor (not shown) operatively coupled to the sleeve 404).

Such a controller 450 can also take readings from sensors (not shown) within the protrusions 418, for example, to ascertain how the beam of light 420 is being affected by the perimeter of the wafer 408 (e.g., how much light is being "blocked" and/or allowed to pass by the wafer 408). The controller 450 can similarly be coupled to an optional display 454 and the robotic arm 430 to control data that is presented on the display 454, and to direct the initial placement of the wafer 408 upon the pins 406 as well as how and when the robotic arm 430 picks up the wafer 408 and moves it to the tool 432.

By way of example, the arm 410 can start scanning the wafer at an initialization position (e.g., of zero degrees) and proceed to rotate around the wafer 408. Once the notch 422 is found, a determination can be made as to where the notch is relative to the initialization position of the wafer 408 (e.g., 138 degrees). Thus, the robotic arm 430 can then pick the wafer 408 up knowing where the notch is located and transfer the wafer to the tool 432 and appropriately place it on a pedestal, for example. This data may also be communicated to the tool 432 so that the wafer 408 can be appropriately oriented therein (e.g., via rotateable shaft 438). Alternatively, since the controller 450 knows the notch location, the controller may control the manner in which the robotic arm 430 picks up the wafer 408 for placement on the clamp 434 such that little or no rotation at shaft 438 is needed.

Figure 5:
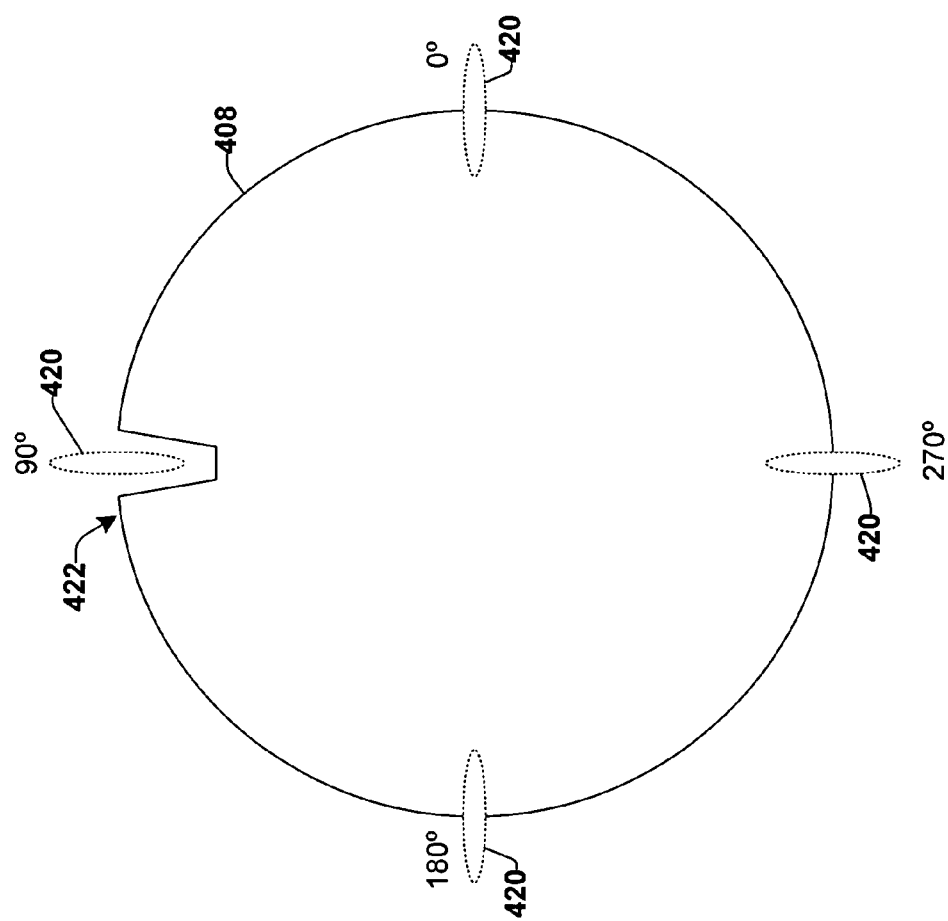
FIG. 5 illustrates an exemplary top view of a wafer and a beam of light shining on the wafer at various locations around the wafer's perimeter.

Some of the scanning data can be presented on the display 454 in one or more forms. FIG. 5 for example, illustrates a top view of a wafer 408 being scanned in the mechanism 400. The beam 420 is illustrated at several scanned locations around the perimeter of the wafer 408, namely an initialization position of zero degrees, and at 90 degrees, 180 degrees and 270 degrees. In the example illustrated the beam has a substantially elliptical cross section. It will be appreciated, however, that the beam can have any suitable configuration. Additionally, in the example shown, not all of the beam 420 is intersected by the perimeter of the wafer 408. The beam may, for example, be about a centimeter wide where about one half of the beam is blocked by the wafer and one half of the beam 420 is allowed to pass through to a beam detector. Other configurations and arrangements, however, may be employed and are contemplated as falling within the scope of the present invention.

Figure 6:
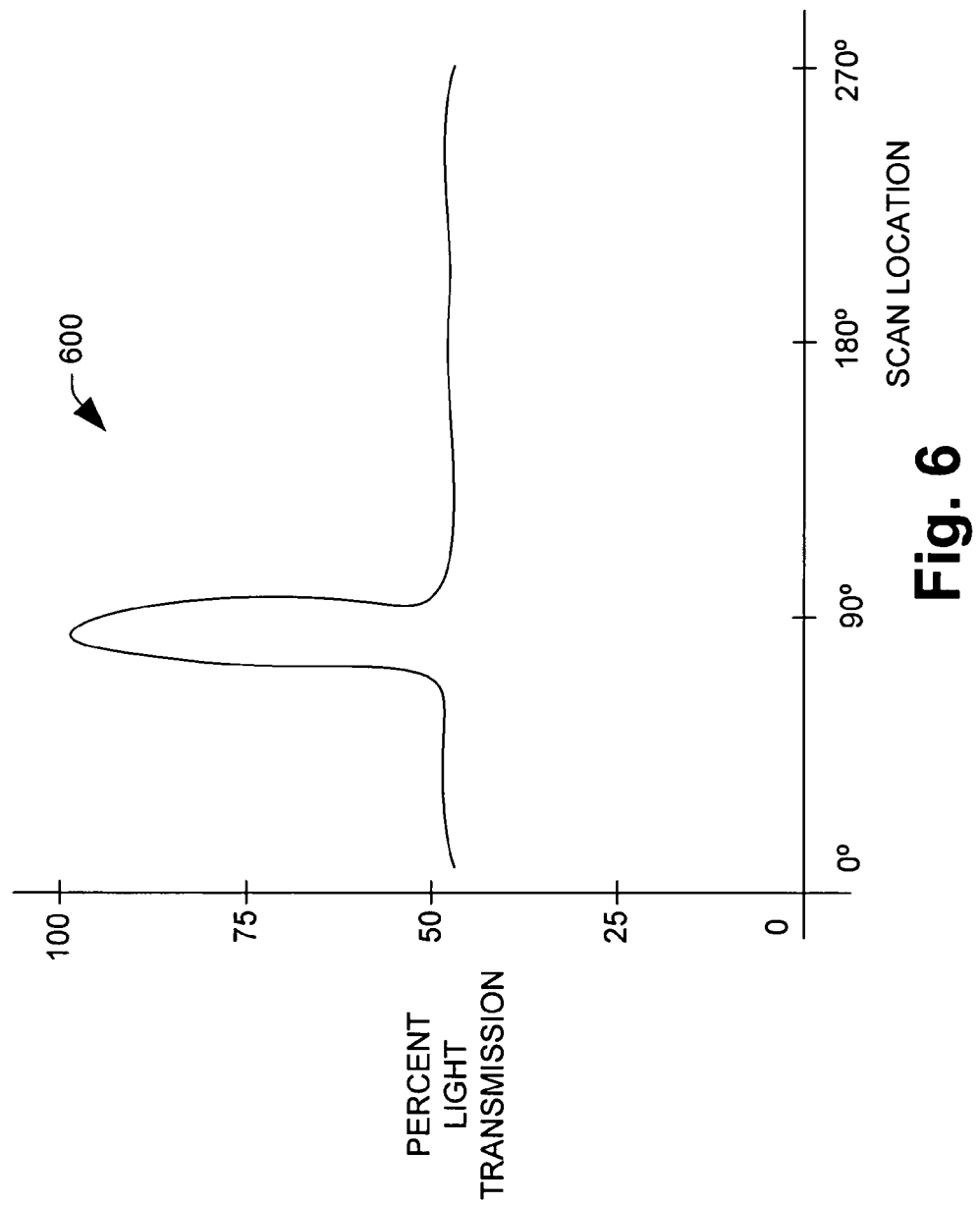
FIG. 6 is a graphical depiction of an amount of light transmitted through a wafer versus a location of a beam of light directed at the wafer, and may correspond to the exemplary arrangement illustrated in FIG. 5.

FIG. 6 is an exemplary plot 600 of light transmitted past the wafer 408 versus scanned locations of the wafer 408. The plot may, for example, correspond to the situation depicted in FIG. 5. The scanned location of the wafer 408 is set forth on the x-axis, while the amount of light transmitted past the wafer 408 is set forth on the y-axis. It will be appreciated that the amount of transmitted light can be detected by a sensor situated, for example, on a protrusion 418 extending under or over the wafer 408. Such a sensor would likely be situated opposite a light emitting source situated on an opposite protrusion extending over or under the wafer 408, respectively.

It can be seen that about 50 percent of the light is transmitted past the wafer at the initialization position of zero degrees, and about 50 percent of the light continues to pass by the wafer until just before 90 degrees. At around the 90 degree scan position, in this example, the percent of transmitted light jumps to nearly 100 percent. After the 90 degree position, the amount of transmitted light quickly returns to about 50 percent and remains at this level as the remainder of the wafer 408 is scanned. This is consistent with the example depicted in FIG. 5 where the notch 422 is located at about the 90 degree position and substantially all of the beam 420 is to allowed pass through the notched area when the beam scans this position. Otherwise, only about half of the beam is allowed to pass by the wafer.

Figure 7:
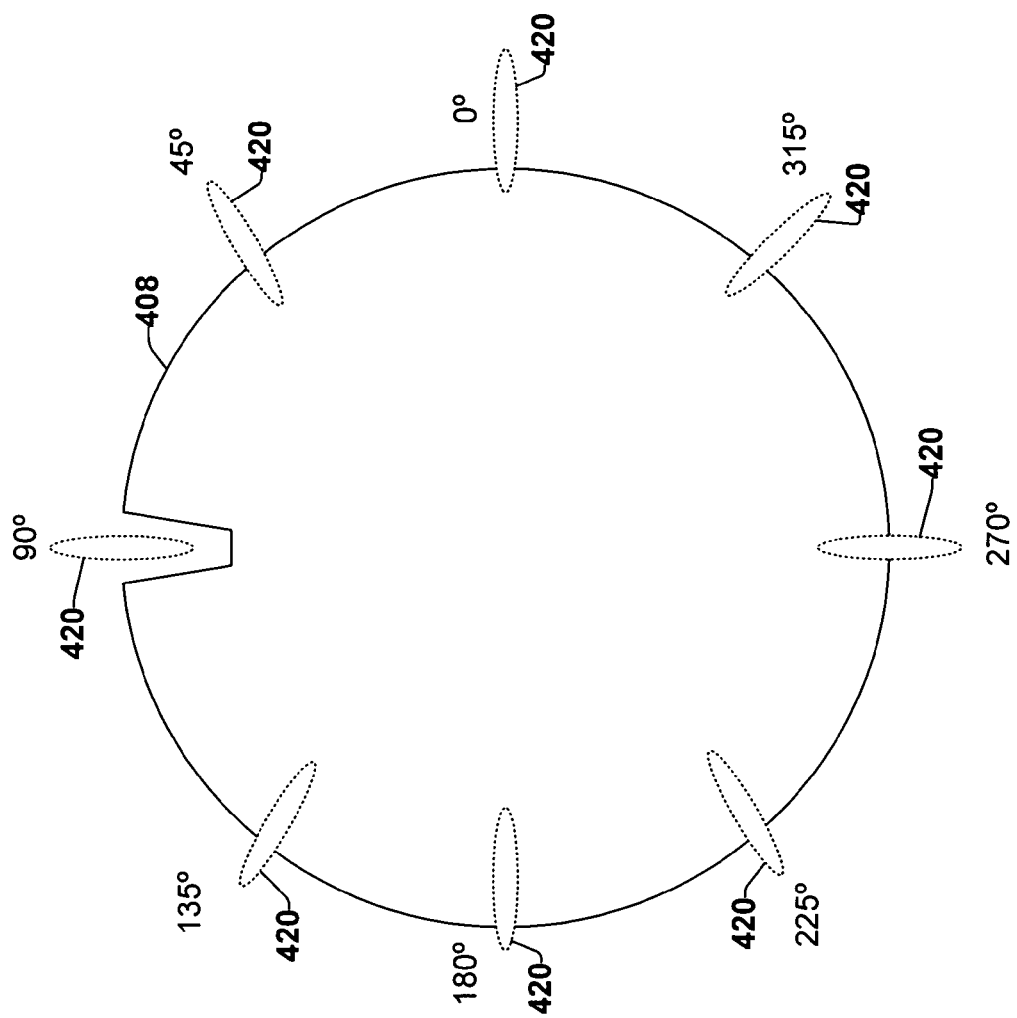
FIG. 7 is another exemplary top view of a wafer and a beam of light shining on the wafer at various locations around the wafer's perimeter.

It will be appreciated that the center of a wafer can also be determined with the apparatus 400. By way of example, FIG. 7 illustrates a top view of a wafer 408 that is not centered in the mechanism 400. As such, different amounts of the beam 420 fall upon the wafer 408 at various locations around the wafer's perimeter. For instance, very little of the beam 420 encounters the wafer 408 at the initialization position of zero degrees. The alignment notch 422 notwithstanding, more and more of the beam gets blocked by the wafer as the scan proceeds over to the 180 degree position. After that, less and less of the beam 420 is blocked by the wafer as the scan returns to the zero degree position. The mechanism 400, and more particularly a controller 450 or processor, can utilize this data to ascertain the center of the wafer 408. The robotic arm 430 can then maneuver the wafer 408 as desired (e.g., to center the wafer 408 upon the pins 406). Additionally, or in the alternative, this information can be passed on to the fabrication tool 432 so that the wafer 408 can be suitably oriented (e.g., rotated) therein.

Figure 8:
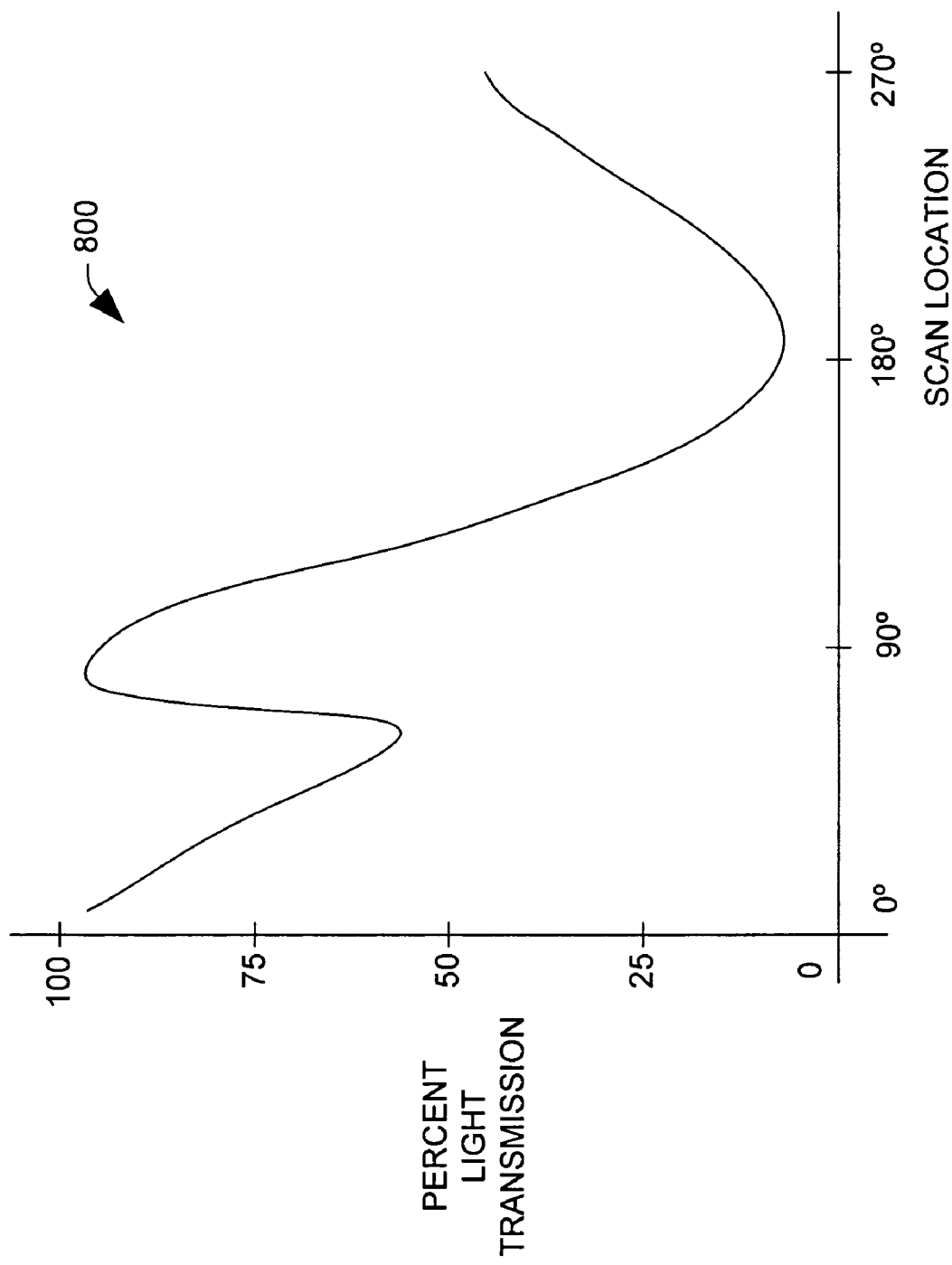
FIG. 8 is another graphical depiction of an amount of light transmitted past a wafer versus a location of a beam of light directed at the wafer, and may correspond to the exemplary arrangement illustrated in FIG. 7.

FIG. 8 is an exemplary plot 800 of transmitted light that may correspond, for example, to the situation depicted in FIG. 7. As in FIG. 6, the scanned location of the wafer 408 is set forth on the x-axis, while the amount of light transmitted past the wafer 408 is set forth on the y-axis. At an initialization position of zero degrees, approximately all of the light passes by the wafer 408. As the scan proceeds, however, the percent of transmitted light begins to gradually decrease. At about the 90 degree position, the percent of transmitted light jumps from about 50 percent to nearly 100 percent, which is indicative of the beam 420 encountering the notch 422. The amount of transmitted light then gradually falls back to about zero as the scan approaches the 180 degree position. More and more light is then allowed to pass by the wafer as the scan moves on to the 270 degree position and eventually back to the initialization position of zero or 360 degrees.

Thus, one or more aspects of the present invention allow a semiconductor fabrication tool to use acquired information and/or data to rotate or otherwise maneuver the wafer at a process position based on existing hardware rather than requiring the aligner to rotate the wafer. By eliminating the requirement to physically rotate the wafer at the aligner, a much simpler mechanism is possible. Since the wafer is no longer moving, the speed of rotation within the alignment mechanism 400 (e.g., the arm 410) can be very fast and limited by motor drives and data acquisition times rather than particle concerns.

Additionally, placing the wafer on a stand or pins mitigates particle contamination since no force is required to hold the wafer in place, as when spinning the wafer. A readout can also be used to determine the center of the wafer and this information can be provided to the tool such that a robot is able to retrieve the wafer correctly centered. This system has application to tool types that allow for individually setting the wafer orientation at the process position or at an intermediate position between the aligner and the process station. One or more aspects of the invention thus provide a wafer alignment function with a lower cost, lower backside particle contamination and faster cycle times, among other things, as compared to conventional systems.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein simply means example, rather than the best.

What is claimed is:

1. A system adapted to locate an alignment marking on a semiconductor wafer comprising:
    a shaft;
    a sleeve moveably mounted upon the shaft;
    one or more support pins mounted to one end of the shaft and adapted to support a wafer situated thereon; and
    an arm member operatively coupled to the sleeve, an end of the arm member extending up toward the wafer when the wafer resides on the one or more support pins, the end of the arm member operative to establish a beam of radiation that may be intersected by the perimeter of the wafer, wherein the wafer can be scanned when on the support pins by rotating the arm member around the perimeter of the wafer and the marking can be identified by a change in the amount of radiation transmitted past the wafer.

2. The system of claim 1, further comprising:
    a controller operatively coupled to the arm to regulate the movement of the arm and to obtain scan data from one or more sensors relating to the amount of radiation transmitted past the wafer at various locations around the wafer.

3. The system of claim 2, the controller also operatively coupled to a robotic arm adapted to place the wafer upon the pins and to remove the wafer from the pins and transfer the wafer to a semiconductor processing tool.

4. The system of claim 3, the controller also operatively coupled to the processing tool to transfer data thereto, the processing tool capable of properly orienting the wafer therein in response to an orientation of the wafer from the robotic arm and scan data.

5. The system of claim 1, further comprising a display adapted to present scan data to a user.

6. The system of claim 2, wherein the controller is configured to identify a center of the wafer by observing gradual changes in the amount of radiation transmitted past the wafer at various locations around the wafer.

7. The system of claim 1, wherein the beam of radiation has a width of about one centimeter.

8. The system of claim 6, wherein the beam of radiation has a substantially elliptical cross section.

9. The system of claim 2, wherein the beam of radiation is established from a radiation emitting source located upon a protrusion situated over or under the wafer and emanating from the end of the arm member.

10. The system of claim 9, wherein the one or more sensors are located within another protrusion emanating from the end of the arm member and situated under or over the wafer and opposite the protrusion containing the radiation emitting source.

11. The system of claim 1, further comprising one or more pivot points between the arm and the sleeve that allow the end of the arm to move closer to or away from the wafer.

12. The system of claim 1, wherein the pins contact a small amount of surface area of a backside of the water to mitigate particle contamination.

13. The system of claim 1, wherein the alignment marking comprises a notch within the perimeter of the wafer.

14. A mechanism adapted to locate an alignment marking on a semiconductor wafer comprising:
    a support structure for supporting the wafer, the support structure contacting a small amount of surface area of a backside of the wafer to mitigate particle contamination;
    a member that moves relative to the wafer when the wafer is supported on the support structure and that directs a beam of radiation having a substantially elliptical cross section at the perimeter of the wafer; and
    a controller operatively coupled to the member to regulate the movement of the member and to obtain scan data from one or more sensors relating to the amount of radiation transmitted past the wafer at various locations around the wafer, and to identify the marking when there is a change in the amount of radiation transmitted past the wafer and to identify a center of the wafer by observing gradual changes in the amount of radiation transmitted past the wafer at various locations around the wafer.

15. The system of claim 14, wherein the beam of radiation has a width of about one centimeter.

* * * * *